United States Patent
Muralidharan et al.

(10) Patent No.: US 10,783,939 B1
(45) Date of Patent: Sep. 22, 2020

(54) TRAINING OF COMMUNICATION INTERFACES ON PRINTED CIRCUIT BOARD

(71) Applicant: Smart IOPS, Inc., Milpitas, CA (US)

(72) Inventors: Kirankumar Muralidharan, Bangalore (IN); Sathishkumar Udayanarayanan, Bangalore (IN)

(*) Notice: Subject to any disclaimer, the term of this patent is extended or adjusted under 35 U.S.C. 154(b) by 0 days.

(21) Appl. No.: 16/430,154

(22) Filed: Jun. 3, 2019

(51) Int. Cl.
| | |
|---|---|
| G11C 7/10 | (2006.01) |
| G11C 7/22 | (2006.01) |
| G11C 8/18 | (2006.01) |
| H05K 1/18 | (2006.01) |
| G11C 8/12 | (2006.01) |

(52) U.S. Cl.
CPC ............. G11C 7/22 (2013.01); G11C 7/1006 (2013.01); G11C 8/12 (2013.01); G11C 8/18 (2013.01); H05K 1/18 (2013.01); H05K 2201/10159 (2013.01)

(58) Field of Classification Search
CPC .......... G11C 7/22; G11C 7/1006; G11C 8/12; G11C 8/18; H05K 1/18; H05K 2201/10159
See application file for complete search history.

(56) References Cited

U.S. PATENT DOCUMENTS

| | | | |
|---|---|---|---|
| 8,028,109 B2 * | 9/2011 | Armstrong ............ | G06F 3/0607 710/62 |
| 8,074,022 B2 * | 12/2011 | Okin ................... | G06F 13/1668 711/115 |
| 8,463,993 B2 * | 6/2013 | Okin ................... | G06F 13/1668 711/115 |
| 10,026,464 B2 * | 7/2018 | d'Abreu ................. | G11C 8/12 |

* cited by examiner

*Primary Examiner* — Pho M Luu
(74) *Attorney, Agent, or Firm* — Goldberg Segalla

(57) ABSTRACT

A printed circuit board (PCB) includes first and second integrated circuits (ICs) connected by way of write and read interfaces. The first IC includes a training circuitry for training the write and read interfaces. The first IC further includes read and write delay elements. The training circuitry trains the read and write interfaces (i.e., configures the read and write delay elements) for correcting signal skews that may be introduced by the read and write interfaces, respectively. The training circuitry configures the write delay element with a first write delay value for which there are no errors while writing data to a buffer memory of the second IC. The training circuitry configures the read delay element with a first read delay value for which there are no errors while reading the data from the buffer memory.

20 Claims, 5 Drawing Sheets

TRAINING OF COMMUNICATION INTERFACES ON PRINTED CIRCUIT BOARD

FIELD OF THE INVENTION

The present invention relates generally to electronic circuit boards, and, more particularly, to training of communication interfaces connecting integrated circuits (ICs) on a printed circuit board (PCB).

BACKGROUND

A PCB typically includes ICs connected to each other by way of interface lines (i.e., PCB traces) for communicating data and clock signals. Placement of the ICs on the PCB generally leads to unequal PCB trace lengths that introduce a signal skew between the data signals and between the data and clock signals. The signal skew causes inconsistencies in sampling of the data signals as the data signals are sampled in a vicinity of edges of the clock signals. Further, the inconsistencies in the sampling of the data signals cause incoherence in the reception of the data signals by the ICs. A conventional approach to reduce the signal skew is based on length matching of the PCB traces. However, the length matching of the PCB traces is unable to reduce the signal skew beyond a certain extent (say beyond a delay margin of 20 picoseconds (ps)).

A known method to reduce the signal skew beyond the delay margin of 20 ps is to train the interface lines by determining delay values for which the clock and data signals are delayed over the interface lines. FIG. 1 shows a schematic block diagram of a conventional PCB 100 that implements the training of the interface lines. The PCB 100 includes first and second ICs 102 and 104 that are connected to each other by way of first and second interfaces 106 and 108 (i.e., the interface lines). The first and second ICs 102 and 104 include first and second training circuitries 110 and 112, respectively. The first and second training circuitries 110 and 112 adhere to a training protocol to train the first and second interfaces 106 and 108, respectively. Further, the first and second training circuitries 110 and 112 store first data D1 for training the first and second interfaces 106 and 108, respectively. The first data D1 is based on the training protocol. The first and second ICs 102 and 104 further include first and second delay elements 114 and 116, respectively.

The first delay element 114 is connected to the first training circuitry 110 and the first interface 106. The first delay element 114 receives the first data D1 from the first training circuitry 110 and delays the first data D1 to generate a delayed version of the first data D1 (hereinafter referred to as "second data D2"). To train the first interface 106, the second data D2 is written to the second training circuitry 112 by way of the first interface 106. However, due to a signal skew introduced by the first interface 106, the second training circuitry 112 receives a delayed version of the second data D2 (hereinafter referred to as "delayed second data DD2"). The aforementioned write operation is repeated multiple times for different delay values of the first delay element 114.

The second training circuitry 112 compares the delayed second data DD2 with the first data D1 for each delay value of the first delay element 114. Based on each comparison, the second training circuitry 112 provides a corresponding first feedback signal FS1 to the first training circuitry 110. Each first feedback signal FS1 is indicative of whether the delayed second data DD2 matches the first data D1. Thus, the first training circuitry 110 identifies a delay value at which the delayed second data DD2 matches the first data D1. Based on the identified delay value, the first training circuitry 110 configures the first delay element 114 with the delay value. The configuration of the first delay element 114 corresponds to training of the first interface 106. The second training circuitry 112 trains the second interface 108 in a manner similar to the training of the first interface 106 by the first training circuitry 110 (i.e., by way of the second delay element 116 and each second feedback signal FS2 received from the first training circuitry 110).

The inclusion of the first and second training circuitries 110 and 112 in each of the first and second ICs 102 and 104, respectively, consumes a significant area of the PCB 100. Further, as the first and second training circuitries 110 and 112 adhere to the same training protocol for training of the first and second interfaces 106 and 108, respectively, the PCB 100 does not provide a provision for interfacing a third IC (not shown) that implements a different training protocol, with the first IC 102 or the second IC 104.

Thus, there is a need for a training method that reduces signal skew on a PCB by consuming less area of the PCB and does not restrict the training of the interfaces to the same training protocol.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
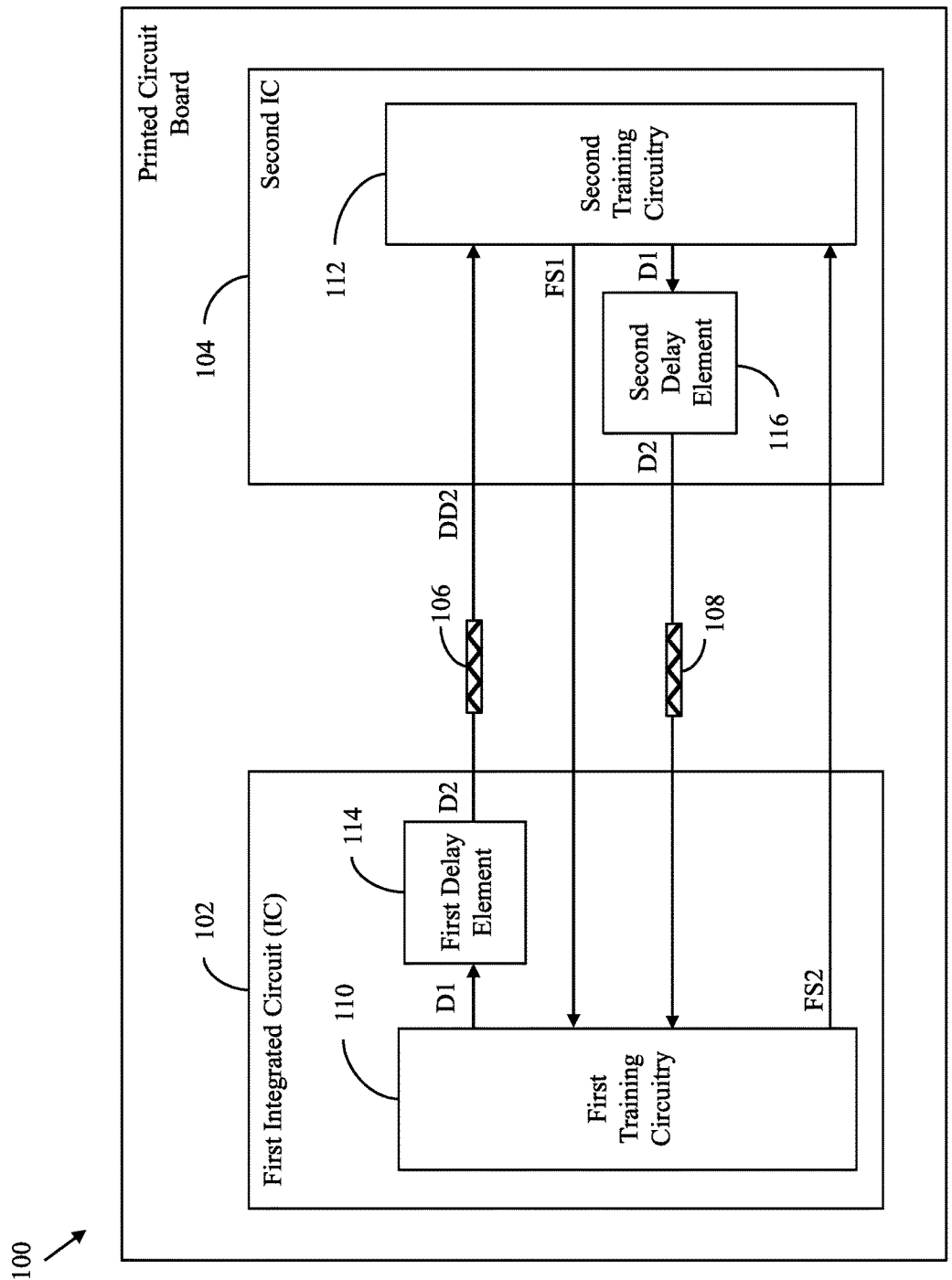
FIG. 1 illustrates a schematic block diagram of a conventional printed circuit board (PCB) that implements training of interface lines.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment, the present invention provides an electronic circuit board. The electronic circuit board includes a buffer memory and a first integrated circuit (IC) that is connected to the buffer memory by way of read and write interfaces. The first IC includes read and write delay elements connected to the read and write interfaces, respectively, and a training circuitry for training the read and write interfaces. The training circuitry is connected to the read and write delay elements. To train the read interface, the training circuitry is configured to write first data to the buffer memory by way of the write interface. The training circuitry is further configured to read second data from the buffer memory by way of the read interface and the read delay element. The reading of the second data is executed for each read delay value of a plurality of read delay values of the read delay element. The training circuitry is further configured to select, from the plurality of read delay values, a first read delay value to configure the read delay element such that the second data matches the first data at the first read delay value. The read interface is trained when the read delay element is configured with the first read delay value. The write interface is trained based on the trained read interface.

In another embodiment, the present invention provides a method for training read and write interfaces that are connected to a first integrated circuit (IC) and a buffer memory. The method includes writing, by a training circuitry of the first IC, first data to the buffer memory by way of the write interface, and reading by the training circuitry, second data from the buffer memory by way of the read interface and a read delay element of the first IC. The reading of the second data is executed for each read delay value of a plurality of read delay values of the read delay element. The method further includes selecting by the training circuitry from the plurality of read delay values, a first read delay value to configure the read delay element such that the second data matches the first data at the first read delay value. The read interface is trained when the read delay element is configured with the first read delay value. The write interface is trained based on the trained read interface.

In yet another embodiment, the present invention provides a method for training read and write interfaces that are connected to a first integrated circuit (IC) and a buffer memory. The method includes writing, by a training circuitry of the first IC, first data to the buffer memory by way of the write interface. The method further includes reading, by the training circuitry, second data from the buffer memory by way of the read interface and a read delay element of the first IC. The reading of the second data is executed for each read delay value of a plurality of read delay values of the read delay element. The method further includes selecting by the training circuitry from the plurality of read delay values, a first read delay value to configure the read delay element such that the second data matches the first data at the first read delay value. The read interface is trained when the read delay element is configured with the first read delay value. The method further includes writing by the training circuitry after the read interface is trained, third data to the buffer memory by way of a write delay element of the first IC and the write interface. The method further includes reading by the training circuitry, fourth data from the buffer memory by way of the read interface and the configured read delay element. The writing and reading of the third and fourth data are executed for each write delay value of a plurality of write delay values of the write delay element, respectively. The method further includes selecting by the training circuitry from the plurality of write delay values, a first write delay value to configure the write delay element such that the fourth data matches the third data at the first write delay value. The write interface is trained when the write delay element is configured with the first write delay value.

Various embodiments of the present invention provide a method to train read and write interfaces of a PCB. The read and write interfaces are trained using a training circuitry and a buffer memory of the PCB. To train the read interface, the training circuitry writes first data to the buffer memory at a first speed. The training circuitry reads second data from the buffer memory at a second speed using a plurality of read delay values of a read delay element of the PCB. The training circuitry compares the first and second data and identifies one or more sets of consecutive read delay values from the plurality of read delay values for which the second data matches the first data. The training circuitry further identifies a first set of consecutive read delay values from the one or more sets of consecutive read delay values based on a count of read delay values in each set of consecutive read delay values. Further, the training circuitry selects a center value (i.e., a first read delay value) of the first set of consecutive read delay values for configuring the read delay element. The training circuitry configures the read delay element with the first read delay value. The configuration of the read delay element with the first read delay value corresponds to the training of the read interface.

After the read interface is trained, the training circuitry trains the write interface. To train the write interface, the training circuitry writes third data to the buffer memory at the second speed using a write delay value of a write delay element of the PCB. The training circuitry reads fourth data from the buffer memory by way of the configured read delay element at the second speed. The training circuitry repeats writing of the third data and reading of the fourth data for the plurality of write delay values. The training circuitry compares the third data and the fourth data for the plurality of write delay values and identifies one or more sets of consecutive write delay values from the plurality of write delay values for which the fourth data matches the third data. The training circuitry further identifies a first set of consecutive write delay values from the one or more sets of consecutive write delay values based on a count of write delay values in each set of consecutive write delay values. Further, the training circuitry selects a center value (i.e., a first write delay value) of the first set of consecutive write delay values for configuring the write delay element. The training circuitry configures the write delay element with the first write delay value. The configuration of the write delay element with the first write delay value corresponds to the training of the write interface. Thus, the read and write interfaces are trained.

The training circuitry verifies the training of the read and write interfaces by writing fifth data to the buffer memory by way of the configured write delay element and the write interface. The training circuitry further reads the sixth data from the buffer memory by way of the read interface and the configured read delay element. The training circuitry determines that the read and write interfaces are successfully trained when the sixth data matches the fifth data.

The method of training the read and write interfaces does not require a presence of the training circuitry on both the first and second ICs. The first IC trains the read and write interfaces by way of a training circuitry on the first IC, thereby eliminating the requirement of a training circuitry on the second IC. Further, an absence of the training circuitry on the second IC reduces an area consumed by the second IC on the PCB. In addition, the PCB provides a provision for interfacing a third IC (not shown) that implements a different training protocol than a standard training protocol for training the read and write interfaces, with the first IC or the second IC.

Figure 2:
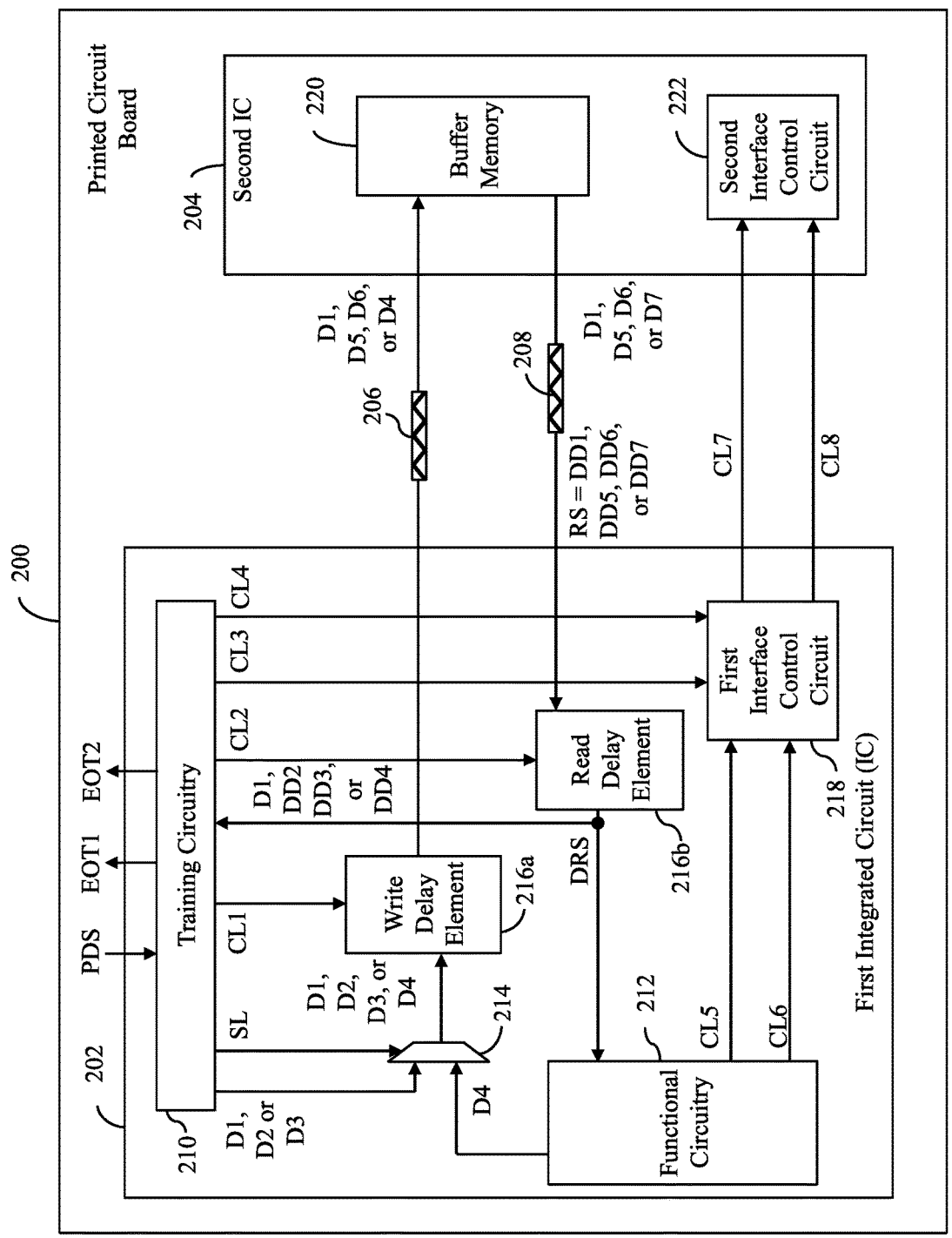
FIG. 2 is a schematic block diagram of a PCB, in accordance with an embodiment of the present invention.

FIG. 2 illustrates a schematic block diagram of a printed circuit board (PCB) 200, in accordance with an embodiment of the present invention. The PCB 200 is an electronic circuit board that includes first and second ICs 202 and 204, a write interface 206, and a read interface 208. The first and second ICs 202 and 204 are connected to each other by way of the write and read interfaces 206 and 208. The first IC 202 performs write and read operations on the second IC 204 by way of the write and read interfaces 206 and 208, respectively.

The first IC 202 includes a training circuitry 210, a functional circuitry 212, a multiplexer 214 (hereinafter referred to as a "mux 214"), write and read delay elements 216a and 216b, and a first interface control circuit 218. The first IC 202 operates in two phases—a training phase and a functional phase. In the training phase, the training circuitry 210 trains the write and read interfaces 206 and 208 in a manner such that the first IC 202 operates optimally in the presence of a signal skew. In the functional phase, the functional circuitry 212 communicates with the second IC 204 by way of the trained write and read interfaces 206 and 208 for performing the write and read operations, respectively. The second IC 204 includes a buffer memory 220 and a second interface control circuit 222.

The training circuitry 210 may include processors, flip-flops, latches, memories, and the like. The training circuitry 210 is connected to a controller (not shown) for receiving a phase determination signal PDS. Based on the phase determination signal PDS, the training circuitry 210 initiates the training phase or the functional phase. In an embodiment, when the phase determination signal PDS is at a logic high state, the training circuitry 210 initiates the training phase by generating a select signal SL at a logic high state. When the phase determination signal PDS is at a logic low state, the training circuitry 210 initiates the functional phase by generating the select signal SL at a logic low state. In another embodiment, the training circuitry 210 initiates the training and functional phases when the phase determination signal PDS is at logic low and logic high states, respectively.

During the training phase, the training circuitry 210 further generates first data D1, second data D2, and third data D3. The first data D1 is indicative of data that is to be written to the buffer memory 220 over multiple cycles of a clock signal (not shown), for training the read interface 208. The clock signal may be generated by the training circuitry 210 and provided to the buffer memory 220 along with the data (such as the first data D1, the second data D2, and the third data D3). The second data D2 is indicative of data that is to be written to the buffer memory 220 over multiple cycles of the clock signal, for training the write interface 206. In an embodiment, the second data D2 is equal to the first data D1. In another embodiment, the second data D2 is different than the first data D1. The third data D3 is indicative of data that is to be written to the buffer memory 220 over multiple cycles of the clock signal, for verifying the training of the write and read interfaces 206 and 208. The third data D3 is a pseudo-random bit sequence. Further, the training circuitry 210 receives a delayed version of a read signal RS (hereinafter referred to as a "delayed read signal DRS") from the read delay element 216b. The read signal RS is indicative of a delayed version of data which is read from the buffer memory 220 during the training of the write and read interfaces 206 and 208. The delay corresponds to the signal skew introduced by the read interface 208.

The training circuitry 210 further generates first through fourth control signals CL1-CL4. The training circuitry 210 provides the first and second control signals CL1 and CL2 to the write delay element 216a and the read delay element 216b, respectively, and the third and fourth control signals CL3 and CL4 to the first interface control circuit 218. The first and second control signals CL1 and CL2 control delay values of the write and read delay elements 216a and 216b, respectively. The third and fourth control signals CL3 and CL4 control operations of the first interface control circuit 218. When the training of the write and read interfaces 206 and 208 is complete, the training circuitry 210 generates and provides a first end of training signal EOT1 to the controller. In one embodiment, to indicate the completion, the training circuitry 210 generates the first end of training signal EOT1 at a logic high state. In another embodiment, the training circuitry 210 generates the first end of training signal EOT1 at a logic low state.

The training circuitry 210 further generates a second end of training signal EOT2 at a logic high state when the training of the write and read interfaces 206 and 208 is successful. The training circuitry 210 further provides the second end of training signal EOT2 at a logic high state to the controller to notify the controller of the successful training of the write and read interfaces 206 and 208. Similarly, when the training of the write and read interfaces 206 and 208 is unsuccessful, the training circuitry 210 generates and provides the second end of training signal EOT2 at a logic low state to the controller to notify the controller of the unsuccessful training of the write and read interfaces 206 and 208. It will be understood by a person skilled in the art that the training circuitry 210 may generate the second end of training signal EOT2 at logic low and high states to indicate the successful and unsuccessful training of the write and read interfaces 206 and 208, respectively.

The functional circuitry 212 may include processors, flip-flops, latches, memories, and the like. During the functional phase, the functional circuitry 212 receives the delayed read signal DRS from the read delay element 216b. Further, the functional circuitry 212 generates fourth data D4. The fourth data D4 is indicative of data that is to be written to the buffer memory 220 over multiple cycles of the clock signal, by way of the trained write interface 206. The functional circuitry 212 further generates fifth and sixth control signals CL5 and CL6 for controlling the operations of the first interface control circuit 218.

The mux 214 is connected to the training circuitry 210 for receiving the select signal SL, the first data D1, the second data D2, and the third data D3. The mux 214 is further connected to the functional circuitry 212 for receiving the fourth data D4. Based on a logic state of the select signal SL, the mux 214 selects and outputs one of the first data D1, the second data D2, the third data D3, or the fourth data D4. In an embodiment, when the select signal SL is at a logic high state (i.e., the first IC 202 is operating in the training phase), the mux 214 selects and outputs one of the first data D1, the second data D2, or the third data D3. The mux 214 selects and outputs the first data D1 or the second data D2 during the training of the read interface 208 or the write interface 206. Further, the mux 214 selects and outputs the third data D3 during the verification of the training of the write and read interfaces 206 and 208. When the select signal SL is at a logic low state (i.e., the first IC 202 is operating in the functional phase), the mux 214 selects and outputs the fourth data D4.

The write delay element 216a is connected to the mux 214 for receiving the first data D1, the second data D2, the third data D3, or the fourth data D4. During the training of the read interface 208, the write delay element 216a receives the first data D1. During the training of the write interface 206, the write delay element 216a receives the second data D2. During the verification of the training of the write and read interfaces 206 and 208, the write delay element 216a receives the third data D3. During the functional phase, the write delay element 216a receives the fourth data D4.

The write delay element 216a includes multiple write delay taps (not shown) that introduce multiple delays of corresponding values (hereinafter referred to as "multiple write delay values") during the writing of the first through fourth data D1-D4. The write delay element 216a is further connected to the training circuitry 210 for receiving the first control signal CL1. Based on the first control signal CL1, the write delay element 216a is configured with a corresponding write delay value.

During the training of the read interface 208, the write delay element 216a is configured with a write delay value of zero. Thus, during the training of the read interface 208, the write delay element 216a outputs the first data D1, and provides the first data D1 to the buffer memory 220 by way of the write interface 206. During the training of the write interface 206, the write delay element 216a outputs a delayed version of the second data D2 (hereinafter referred to as "delayed second data DD2") and provides the delayed second data DD2 to the buffer memory 220 by way of the write interface 206. During the verification of the training of the write and read interfaces 206 and 208, the write delay element 216a outputs a delayed version of the third data D3 (hereinafter referred to as "delayed third data DD3") and provides the delayed third data DD3 to the buffer memory 220 by way of the write interface 206. Similarly, during the functional phase, the write delay element 216a outputs a delayed version of the fourth data D4 (hereinafter referred to as "delayed fourth data DD4") and provides the delayed fourth data DD4 to the buffer memory 220 by way of the write interface 206.

The write interface 206 is a communication interface for connecting the first and second ICs 202 and 204 (i.e., connecting the write delay element 216a to the buffer memory 220). The write interface 206 includes a first interface line (i.e., a first PCB trace). The first IC 202 writes data to the buffer memory 220 by way of the write interface 206. Thus, the write delay element 216a provides one of the first data D1, the delayed second data DD2, the delayed third data DD3, or the delayed fourth data DD4 to the write interface 206. The first data D1 is provided at a first speed whereas the delayed second data DD2, the delayed third data DD3, or the delayed fourth data DD4 is provided at a second speed. In an example, the first speed is in megahertz (MHz) range and the second speed is in gigahertz (GHz) range. When data (such as the first data D1, the delayed second data DD2, the delayed third data DD3, or the delayed fourth data DD4) is written by way of the write interface 206, the write interface 206 may introduce a signal skew to the data with respect to the clock signal, before the data is stored in the buffer memory 220. As the first speed is in the MHz range, the first data D1 is written without any errors. However, as the second speed is in the GHz range, the write interface 206 delays the delayed second data DD2 to output a delayed version of the delayed second data DD2 (hereinafter referred to as "fifth data D5"). The write interface 206 further delays the delayed third data DD3 to output delayed version of the delayed third data DD3 (hereinafter referred to as "sixth data D6") and delays the delayed fourth data DD4 such that a delayed version of the delayed fourth data DD4 is the fourth data D4. The write interface 206 thus provides the first data D1, the fifth data D5, the sixth data D6, and the fourth data D4 to the buffer memory 220.

The read interface 208 is a communication interface connecting the first and second ICs 202 and 204. The read interface 208 includes a second interface line (i.e., a second PCB trace). The first IC 202 reads data from the buffer memory 220 by way of the read interface 208. The data read from the buffer memory 220 may be one of the first data D1, the fifth data D5, the sixth data D6, or seventh data D7. The seventh data D7 is indicative of data that is to be read by way of the read interface 208 from the buffer memory 220 in the functional phase. The seventh data D7 is read over multiple cycles of the clock signal. Thus, the read interface 208 receives one of the first data D1, the fifth data D5, the sixth data D6, or the seventh data D7 from the buffer memory 220. Before the reception of the data by the first IC 202, the read interface 208 may introduce a signal skew to the data read at the second speed. The read interface 208, thus, delays each of the first and fifth through seventh data D1 and D5-D7 to output delayed versions of the first and fifth through seventh data DD1 and DD5-DD7, respectively (hereinafter referred to as "delayed first and delayed fifth through seventh data DD1 and DD5-DD7", respectively). The read interface 208 provides the delayed first and delayed fifth through seventh data DD1 and DD5-DD7 to the read delay element 216b by way of a read signal RS.

The read delay element 216b is connected to the buffer memory 220 by way of the read interface 208. The read delay element 216b receives the read signal RS from the read interface 208. During the training of the read interface 208, the read signal RS is the delayed first data DD1. During the training of the write interface 206, the read signal RS is the delayed fifth data DD5. During the verification of the training of the write and read interfaces 206 and 208, the read signal RS is the delayed sixth data DD6. During the functional phase, the read signal RS is the delayed seventh data DD7.

The read delay element 216b includes multiple read delay taps (not shown) that introduce delays of corresponding values (hereinafter referred to as "multiple read delay values") to the read signal RS. The read delay element 216b is further connected to the training circuitry 210 for receiving the second control signal CL2. Based on the second control signal CL2, the read delay element 216b is configured with a read delay value to correct the signal skew introduced by the read interface 208. Thus, the read delay element 216b outputs the delayed read signal DRS. The read delay element 216b provides the delayed read signal DRS to the training and functional circuitries 210 and 212 in the training and functional phases, respectively.

During the training of the read interface 208, the delayed read signal DRS is a delayed version of the delayed first data DD1. During the training of the write interface 206, the delayed read signal DRS is a delayed version of the delayed fifth data DD5. During the verification of the training of the write and read interfaces 206 and 208, the delayed read signal DRS is a delayed version of the delayed sixth data DD6. In the functional phase, the delayed read signal DRS is a delayed version of the delayed seventh data DD7.

The first interface control circuit 218 may include processors, flip-flops, latches, memories, and the like. The first interface control circuit 218 is connected to the training circuitry 210 for receiving the third and fourth control signals CL3 and CL4 during the training phase. Further, the first interface control circuit 218 is connected to the functional circuitry 212 for receiving the fifth and sixth control signals CL5 and CL6 during the functional phase. Based on the third control signal CL3 or the fifth control signal CL5, the first interface control circuit 218 generates a seventh control signal CL7. Further, the first interface control circuit 218 provides the seventh control signal CL7 to the second interface control circuit 222. A logic state of the seventh control signal CL7 indicates one of the write or read operation. Similarly, based on the fourth control signal CL4 or the sixth control signal CL6, the first interface control circuit 218 generates and provides an eighth control signal CL8 to the second interface control circuit 222. A logic state of the eighth control signal CL8 indicates the speed of the write or read operation (i.e., the first speed or the second speed). In an embodiment, the first interface control circuit 218 communicates with the second interface control circuit 222 by way of a control bus (not shown) that includes multiple channels (not shown) for communicating multiple control signals (such as the seventh and eighth control signals CL7 and CL8), respectively.

To initiate writing of the first data D1 to the buffer memory 220, the training circuitry 210 generates the third control signal CL3 at a logic high state. The first interface control circuit 218 communicates the initiation of the write operation to the second interface control circuit 222 by generating the seventh control signal CL7 at a logic high state. Further, to initiate reading of the first data D1 from the buffer memory 220, the training circuitry 210 generates the third control signal CL3 at a logic low state. The first interface control circuit 218 communicates the initiation of the read operation to the second interface control circuit 222 by generating the seventh control signal CL7 at a logic low state.

To initiate writing of the delayed second data DD2 to the buffer memory 220, the training circuitry 210 generates the third control signal CL3 at a logic high state. The first interface control circuit 218 thus generates the seventh control signal CL7 at a logic high state. Further, to initiate reading of the fifth data D5 from the buffer memory 220, the training circuitry 210 generates the third control signal CL3 at a logic low state. The first interface control circuit 218 thus generates the seventh control signal CL7 at a logic low state.

To initiate writing of the delayed third data DD3 to the buffer memory 220, the training circuitry 210 generates the third control signal CL3 at a logic high state. The first interface control circuit 218 thus generates the seventh control signal CL7 at a logic high state. Further, to initiate reading of the sixth data D6 from the buffer memory 220, the training circuitry 210 generates the third control signal CL3 at a logic low state. The first interface control circuit 218 thus generates the seventh control signal CL7 at a logic low state.

To initiate writing of the delayed fourth data DD4 to the buffer memory 220, the functional circuitry 212 generates the fifth control signal CL5 at a logic high state. The first interface control circuit 218 thus generates the seventh control signal CL7 at a logic high state. Further, to initiate reading of the seventh data D7 from the buffer memory 220, the functional circuitry 212 generates the fifth control signal CL5 at a logic low state. The first interface control circuit 218 thus generates the seventh control signal CL7 at a logic low state. The first interface control circuit 218 may further communicate, by way of a ninth control signal (not shown), to the functional circuitry 212, the successful reception of data (such as the seventh data D7) from the buffer memory 220.

During the training phase, to initiate the read or write operation at the first speed, the training circuitry 210 generates the fourth control signal CL4 at a logic high state. The first interface control circuit 218 thus generates the eighth control signal CL8 at a logic high state. Further, to initiate the read or write operation at the second speed, the training circuitry 210 generates the fourth control signal CL4 at a logic low state. The first interface control circuit 218 thus generates the eighth control signal CL8 at a logic low state.

Similarly during the functional phase, to initiate the read or write operation at the second speed, the functional circuitry 212 generates the sixth control signal CL6 at a logic low state. The first interface control circuit 218 thus generates the eighth control signal CL8 at a logic low state. In an example, the first interface control circuit 218 initiates the writing of the first data D1 at the first speed (i.e., in MHz range). The writing of the first data D1 at the first speed ensures that the first data D1 is accurately written to the buffer memory 220. Further, the first interface control circuit 218 initiates the writing of the delayed second data DD2, the delayed third data DD3, and the delayed fourth data DD4, and the reading of the first and fifth through seventh data D1 and D5-D7 at the second speed.

The buffer memory 220 is connected to the write and read delay elements 216a and 216b by way of the write and read interfaces 206 and 208, respectively. In an embodiment, the buffer memory 220 is a volatile memory such as a static random access memory (SRAM), a dynamic random access memory (DRAM), and the like. In another embodiment, the buffer memory 220 is a non-volatile memory such as a NAND flash drive, a NOR flash drive, a hard disk drive (HDD), and the like. The buffer memory 220 stores the first data D1, fifth data D5, and sixth data D6. The buffer memory 220 further stores the seventh data D7.

The second interface control circuit 222 is connected to the first interface control circuit 218 for receiving the seventh control signal CL7 and the eighth control signal CL8. Based on the seventh control signal CL7, the second interface control circuit 222 controls the write and read operations of the buffer memory 220. For example, when the first interface control circuit 218 initiates the writing of the first data D1, the delayed second data DD2, the delayed third data DD3, or the delayed fourth data DD4, the second interface control circuit 222 initializes the buffer memory 220 for reception and subsequent storage, thereby facilitating the write operation. Similarly, when the first interface control circuit 218 initiates the reading of the first data D1, the fifth data D5, the sixth data D6, or the seventh data D7, the second interface control circuit 222 initializes the buffer memory 220 for transmission of the first and fifth through seventh data D1 and D5-D7 over the read interface 208, thereby facilitating the read operation. The second interface control circuit 222 is further connected to a processor (not shown) of the second IC 204 for communicating the successful reception of data (such as the fourth data D4) from the functional circuitry 212. Further, based on the logic state of the eighth control signal CL8, the second interface control circuit 222 sets the speed of read and write operations between the first IC 202 and the second IC 204.

The following paragraphs describe a preferred embodiment of training the write and read interfaces 206 and 208. In such preferred embodiment, the training circuitry 210 receives the phase determination signal PDS at a logic high state and initiates the training of the write and read interfaces 206 and 208. The training circuitry 210 thus generates the select signal SL at a logic high state. In an embodiment, the read interface 208 is trained prior to the training of the write interface 206. To train the read interface 208, the training circuitry 210 further generates the first data D1. The mux 214 thus receives and provides the first data D1 to the write delay element 216a. Further, the training circuitry 210 generates the first control signal CL1. Based on the first control signal CL1, the write delay element 216a sets a write delay value (i.e., selects a write delay tap) to zero.

The training circuitry 210 initiates the writing of the first data D1 to the buffer memory 220 at the first speed by generating the third and fourth control signals CL3 and CL4 at logic high states. As the third control signal CL3 is at a logic high state, the first interface control circuit 218 generates the seventh control signal CL7 at a logic high state. Further, as the writing of the first data D1 is to be performed at the first speed, the first interface control circuit 218 generates the eighth control signal CL8 at a logic high state. The write delay element 216a thus provides the first data D1 to the buffer memory 220 by way of the write interface 206. Before writing the first data D1 to the buffer memory 220, the first data D1 is sampled, based on the clock signal, by a first sampling circuit (not shown) that is included in the second IC 204. The first sampling circuit implements the technique of consistent sampling to sample the first data D1 away from edges of the clock signal. The sampling of the first data D1 away from the edges ensures that the first data D1 is written to the buffer memory 220 without any errors.

After the first data D1 is written to the buffer memory 220, the training circuitry 210 generates the third and fourth control signals CL3 and CL4 at logic low states to indicate the initiation of the read operation of the first data D1 at the second speed. As the third control signal CL3 is at a logic low state, the first interface control circuit 218 generates the seventh control signal CL7 at a logic low state. Further, as the reading of the first data D1 is to be performed at the second speed, the first interface control circuit 218 generates the eighth control signal CL8 at a logic low state.

The training circuitry 210 initializes a read delay counter (not shown) of the read delay element 216b to one and generates the second control signal CL2. The read delay counter is a counter that maintains a count of the read delay values associated with the read operation. In an embodiment, the read delay counter is included in the read delay element 216b. In another embodiment, the read delay counter is included in the training circuitry 210. Based on the second control signal CL2, the read delay element 216b selects a read delay value (i.e., selects a read delay tap of the read delay element 216b).

The read delay element 216b receives the read signal RS, i.e., the delayed first data DD1, and provides the delayed version of the delayed first data DD1 (i.e., the delayed read signal DRS) to the training circuitry 210. Before providing the delayed read signal DRS to the training circuitry 210, the delayed read signal DRS is sampled, based on the clock signal, by a second sampling circuit (not shown) that is included in the first IC 202.

The training circuitry 210 checks whether a value of the read delay counter is equal to a total number of read delay taps in the read delay element 216b (i.e., a count of the multiple read delay values). If the value of the read delay counter is less than the total number of read delay taps, the training circuitry 210 increments the read delay counter and repeats the reading of the first data D1 until the value of read delay counter is equal to the total number of read delay taps in the read delay element 216b. The read delay value of the read delay element 216b increases with an increment of the read delay counter. In an example, the read delay value of the read delay element 216b increases by 1 picosecond with an increment of the read delay counter. Thus, the read operation of the first data D1 is repeated for multiple read delay values of the read delay element 216b.

The training circuitry 210 compares the first data D1 and the delayed read signal DRS for each read delay value. The training circuitry 210 identifies one or more sets of consecutive read delay values from the multiple read delay values for which the delayed read signal DRS matches the first data D1. In other words, delaying the read signal RS by a read delay value of the one or more sets of consecutive read delay values ensures that the delayed read signal DRS is sampled away from the edges of the clock signal. The sampling of the delayed read signal DRS away from the edges ensures that the first data D1 is read from the buffer memory 220 without any errors.

The training circuitry 210 further selects a first set of read delay values, from the sets of consecutive read delay values, for which a count of consecutive read delay values is maximum. In an embodiment, a center value (hereinafter referred to as "a first read delay value") of the first set of read delay values is selected by the training circuitry 210 for configuring the read delay element 216b. The training circuitry 210 thus generates the second control signal CL2 and provides it to the read delay element 216b for configuring the read delay element 216b with the first read delay value. The read delay element 216b is thus configured with the first read delay value by the training circuitry 210. The configuration of the read delay element 216b with the first read delay value corresponds to the training of the read interface 208. Thus, the signal skew introduced by the read interface 208 is corrected by delaying the delayed first data DD1 by the first delay value.

After the read interface 208 is trained, the training circuitry 210 initiates the training of the write interface 206 and generates the second data D2 and the select signal SL at a logic high state. The mux 214 thus provides the second data D2 to the write delay element 216a. The training circuitry 210 initializes a write delay counter (not shown) of the write delay element 216a to one. The write delay counter is a counter that maintains a count of the write delay values associated with the write operation. In an embodiment, the write delay counter is included in the write delay element 216a. In another embodiment, the write delay counter is included in the training circuitry 210. Further, the training circuitry 210 generates the first control signal CL1. Based on the first control signal CL1, the write delay element 216a selects a write delay value (i.e., selects a write delay tap of the write delay element 216a) and introduces a corresponding delay to the second data D2. Thus, the write delay element 216a outputs the delayed second data DD2.

The training circuitry 210 initiates writing of the delayed second data DD2 to the buffer memory 220 at the second speed by generating the third and fourth control signals CL3 and CL4 at logic high states. The first interface control circuit 218 thus generates the seventh control signal CL7 at a logic high state. Further, as the write operation is to be performed at the second speed, the first interface control circuit 218 generates the eighth control signal CL8 at a logic low state. The fifth data D5 is thus written to the buffer memory 220. Before writing the fifth data D5 to the buffer memory 220, the fifth data D5 is sampled by the first sampling circuit based on the clock signal.

When the write operation of the fifth data D5 is complete, the training circuitry 210 generates the third and fourth control signals CL3 and CL4 at logic low states. The third control signal CL3 at a logic low state indicates the initiation of the read operation of the fifth data D5 at the second speed. The first interface control circuit 218 thus generates the seventh control signal CL7 at a logic low state. Further, as the read operation is to be performed at the second speed, the first interface control circuit 218 generates the eighth control signal CL8 at a logic low state.

The configured read delay element 216b receives the read signal RS, i.e., the delayed fifth data DD5, by way of the read interface 208. As the read delay element 216b is configured with the first read delay value, the read delay element 216b outputs a delayed version of the delayed fifth data DD5 (i.e., the delayed read signal DRS) to the training circuitry 210. Before providing the delayed read signal DRS to the training circuitry 210, the delayed read signal DRS is sampled by the second sampling circuit based on the clock signal. Further, delaying the read signal RS by the first read delay value ensures that the delayed read signal DRS is sampled away from the edges of the clock signal. The sampling of the delayed read signal DRS away from the edges ensures that the fifth data D5 is read from the buffer memory 220 without any errors.

The training circuitry 210 checks whether a value of the write delay counter is equal to a total number of write delay taps in the write delay element 216*a* (i.e., a count of the multiple write delay values). If the value of the write delay counter is less than a total number of write delay taps, the training circuitry 210 increments the write delay counter and repeats the write operation of the second data D2 and the read operation of the fifth data D5 until the value of write delay counter is equal to the total number of write delay taps. The write delay value of the write delay element 216*a* increases with an increase in the write delay counter. In an example, the write delay value of the write delay element 216*a* increases by 1 picosecond with an increment of the write delay counter. Thus, the write operation of the second data D2 and the read operation of the fifth data D5 are repeated for multiple write delay values of the write delay element 216*a*.

The training circuitry 210 compares the second data D2 and the delayed read signal DRS for each write delay value. The training circuitry 210 identifies one or more sets of consecutive write delay values for which the delayed read signal DRS matches the second data D2. In other words, delaying the second data D2 by a write delay value of the one or more sets of conseuctive write delay values ensures that the fifth data D5 (i.e., the delayed version of the delayed second data DD2) is sampled away from the edges of the clock signal. The sampling of the fifth data D5 away from the edges ensures that the second data D2 is written in the buffer memory 220 without any errors.

The training circuitry 210 further selects a first set of write delay values, from the sets of consecutive write delay values, for which a count of consecutive write delay values is maximum. In an embodiment, a center value (hereinafter referred to as "a first write delay value") of the first set of write delay values, is selected by the training circuitry 210 for configuring the write delay element 216*a*. The first write delay value is a value at which the second data D2 matches the delayed version of the delayed fifth data DD5. The write delay element 216*a* is configured with the first write delay value by way of the first control signal CL1. The training of the write interface 206 corresponds to configuration of the write delay element 216*a* with the first write delay value. Thus, the delaying of the second data D2 by the first delay value corrects the signal skew introduced by the write interface 206.

The training circuitry 210 further verifies (i.e., tests) the training of the write and read interfaces 206 and 208 once the write and read interfaces 206 and 208 are trained. The training circuitry 210 thus generates the third data D3 and the select signal SL at a logic high state. In an embodiment, the third data D3 is a pseudo-random bit sequence. The mux 214 thus provides the third data D3 to the write delay element 216*a*. The configured write delay element 216*a* delays the third data D3 by the first write delay value. Thus, the write delay element 216*a* outputs the delayed third data DD3.

The training circuitry 210 initiates writing of the third data D3 to the buffer memory 220 at the second speed by generating the third and fourth control signals CL3 and CL4 at logic high and low states, respectively. The first interface control circuit 218 thus generates the seventh control signal CL7 at a logic high state. Further, as the write operation is to be performed at the second speed, the first interface control circuit 218 generates the eighth control signal CL8 at a logic low state. The write delay element 216*a* provides the delayed third data DD3 to the buffer memory 220 by way of the write interface 206. The write interface 206 thus writes the sixth data D6 to the buffer memory 220. Before writing the sixth data D6 to the buffer memory 220, the sixth data D6 is sampled by the first sampling circuit based on the clock signal.

When the write operation of the sixth data D6 is completed, the training circuitry 210 generates the third and fourth control signals CL3 and CL4 at logic low states. The third control signal CL3 at a logic low state indicates the initiation of the read operation of the sixth data D6. The first interface control circuit 218 thus generates the seventh control signal CL7 at a logic low state. Further, as the read operation is to be performed at the second speed, the first interface control circuit 218 generates the eighth control signal CL8 at a logic low state.

The configured read delay element 216*b* receives the read signal RS, i.e., the delayed sixth data DD6, from the buffer memory 220 by way of the read interface 208. As the read delay element 216*b* is configured with the first read delay value, the read delay element 216*b* delays the delayed sixth data DD6 by the first read delay value and outputs the delayed read signal DRS to the training circuitry 210. Before providing the delayed read signal DRS to the training circuitry 210, the delayed read signal DRS is sampled by the second sampling circuit based on the clock signal. The training circuitry 210 compares the third data D3 and the delayed read signal DRS. The training circuitry 210 determines that the write and read interfaces 206 and 208 are successfully trained when the delayed version of the delayed sixth data DD6 matches the third data D3.

Once the write and read interfaces 206 and 208 are trained, the training circuitry 210 generates and provides the first end of training signal EOT1 at a logic high state to the controller. When the training of the write and read interfaces 206 and 208 is successful, the training circuitry 210 generates and provides the second end of training signal EOT2 at a logic high state to the controller. Similarly, when the training of the write and read interfaces 206 and 208 is unsuccessful, the training circuitry 210 generates and provides the second end of training signal EOT2 at a logic low state to the controller. Thus, the training circuitry 210 notifies the controller of the successful or unsuccessful training of the write and read interfaces 206 and 208. When the training of the write and read interfaces 206 and 208 is unsuccessful, the controller may re-initiate the training.

When the training of the write and read interfaces 206 and 208 is successful, the controller generates the phase determination signal PDS at a logic low state and provides the phase determination signal PDS at a logic low state to the training circuitry 210. Thus, the training circuitry 210 initiates the functional phase of the first IC 202. The training circuitry 210 generates the select signal SL at a logic low state, and provides it to the mux 214. The mux 214 thus provides the fourth data D4 to the write delay element 216*a*. The configured write delay element 216*a* outputs the delayed fourth data DD4 which is based on the first write delay value. The functional circuitry 212 initiates the writing of the delayed fourth data DD4 to the buffer memory 220 at the second speed by generating the fifth and sixth control signals CL5 and CL6 at logic high and low states, respectively. The first interface control circuit 218 thus generates the seventh control signal CL7 at a logic high state. Further, as the write operation is to be performed at the second speed, the first interface control circuit 218 generates the eighth control signal CL8 at a logic low state.

The write delay element 216a provides the delayed fourth data DD4 to the buffer memory 220 by way of the write interface 206. As the fourth data D4 is written by way of the configured write delay element 216a, the delaying of the fourth data D4 by the first write delay value corrects the signal skew introduced by the write interface 206 and ensures that the sampling of the fourth data D4 is consistent. Thus, the buffer memory 220 stores the fourth data D4. The second interface control circuit 222 communicates the successful reception of the fourth data D4 to the processor of the second IC 204. In an embodiment, upon the successful reception of the fourth data D4, the processor transfers the fourth data D4 from the buffer memory 220 to a primary memory (not shown) of the second IC 204.

To read data (such as the seventh data D7) from the buffer memory 220 at the second speed, the functional circuitry 212 generates the fifth and sixth control signals CL5 and CL6 at logic low states. The first interface control circuit 218 thus generates the seventh control signal CL7 at a logic low state. Further, as the read operation is to be performed at the second speed, the first interface control circuit 218 generates the eighth control signal CL8 at a logic low state.

The first interface control circuit 218 provides the seventh and eighth control signals CL7 and CL8 to the second interface control circuit 222 at logic low states. Further, the configured read delay element 216b receives the read signal RS, i.e., the delayed seventh data DD7, from the buffer memory 220 by way of the read interface 208. The configured read delay element 216b outputs a delayed version of the delayed seventh data DD7 (i.e., the delayed read signal DRS). Before providing the delayed read signal DRS to the functional circuitry 212, the delayed read signal DRS is sampled by the second sampling circuit based on the clock signal. As the seventh data D7 is read by way of the configured read delay element 216b, the signal skew introduced by the read interface 208 is corrected by delaying the delayed seventh data DD7 by the first read delay value. Thus, the functional circuitry 212 receives the seventh data D7 from the buffer memory 220.

Although the present invention describes the training of the write and read interfaces 206 and 208 (that include the first and second interface lines, respectively) by configuring the write and read delay elements 216a and 216b, respectively, the scope of the present invention is not limited to it. In various other embodiments of the present invention, each of the write and read interfaces 206 and 208 may include multiple interface lines, without deviating from the scope of the present invention. In such scenarios, the first IC 202 may include multiple write delay elements (such as the write delay element 216a) connected to the corresponding multiple interface lines of the write interface 206. Similarly, the first IC 202 may include multiple read delay elements (such as the read delay element 216b) connected to the corresponding multiple interface lines of the read interface 208. Further, the write and read interfaces 206 and 208, each including the interface lines, are trained by configuring the corresponding multiple write and read delay elements in a manner similar to the configuration of the write and read delay elements 216a and 216b, respectively. Hence, in such scenarios, the first data D1, the second data D2, the third data D3, the fourth data D4, and the seventh data D7 are multi-bit data that are written to or read from the buffer memory 220 over multiple cycles of the clock signal. Further, read delay values (such as the first read delay value) that are selected for configuring the multiple read delay elements may be equal or different. Similarly, write delay values (such as the first write delay value) that are selected for configuring the multiple write delay elements may be equal or different. Further, the training of the write and read interfaces 206 and 208 corrects a signal skew that is introduced between various bits of the multi-bit data as well as between the multi-bit data and the clock signal.

Figure 3A:
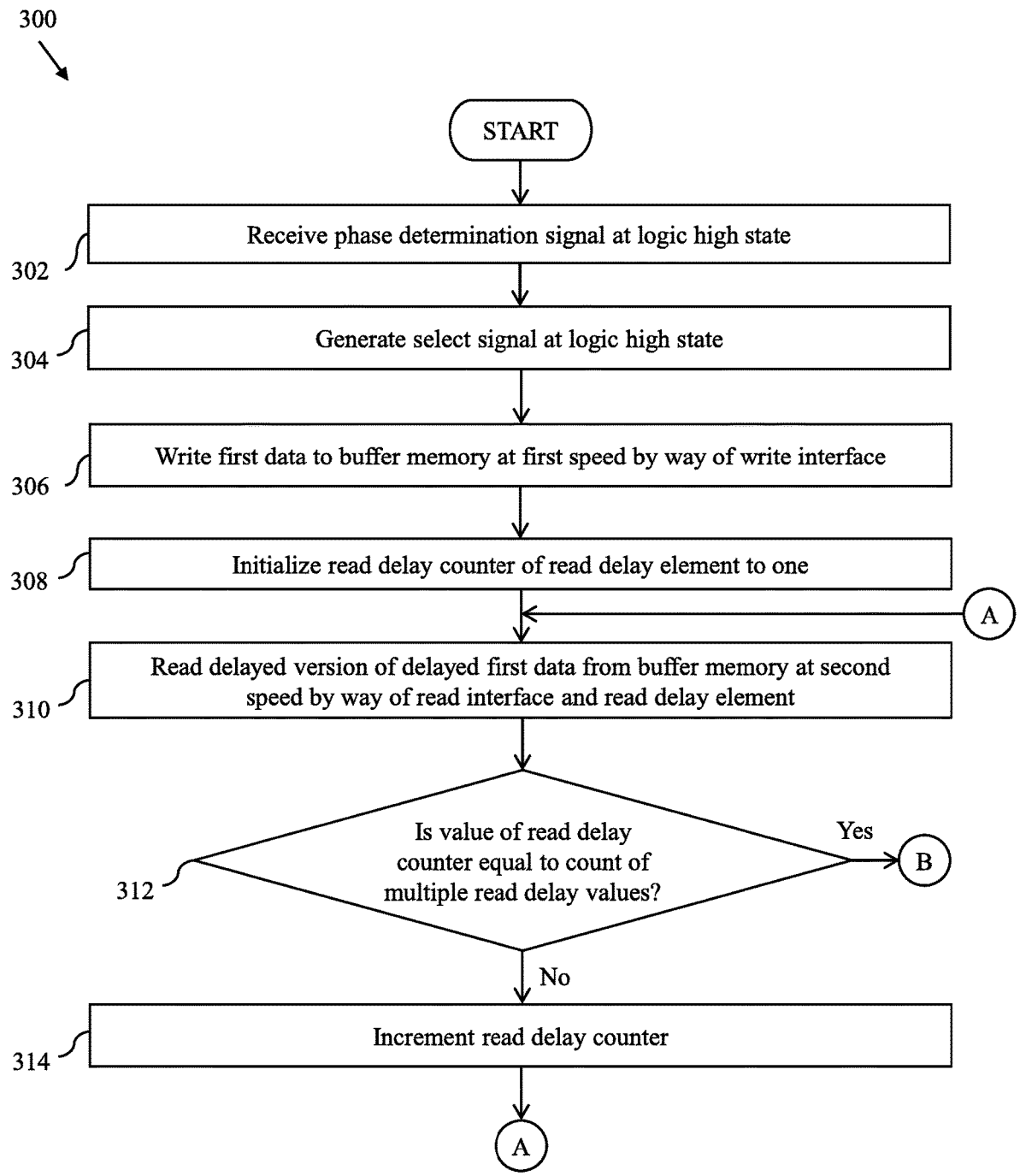
FIGS. 3A-3C, collectively, represent a flow chart that illustrates a method for training write and read interfaces of the PCB of FIG. 2, in accordance with an embodiment of the present invention.
Figure 3B:
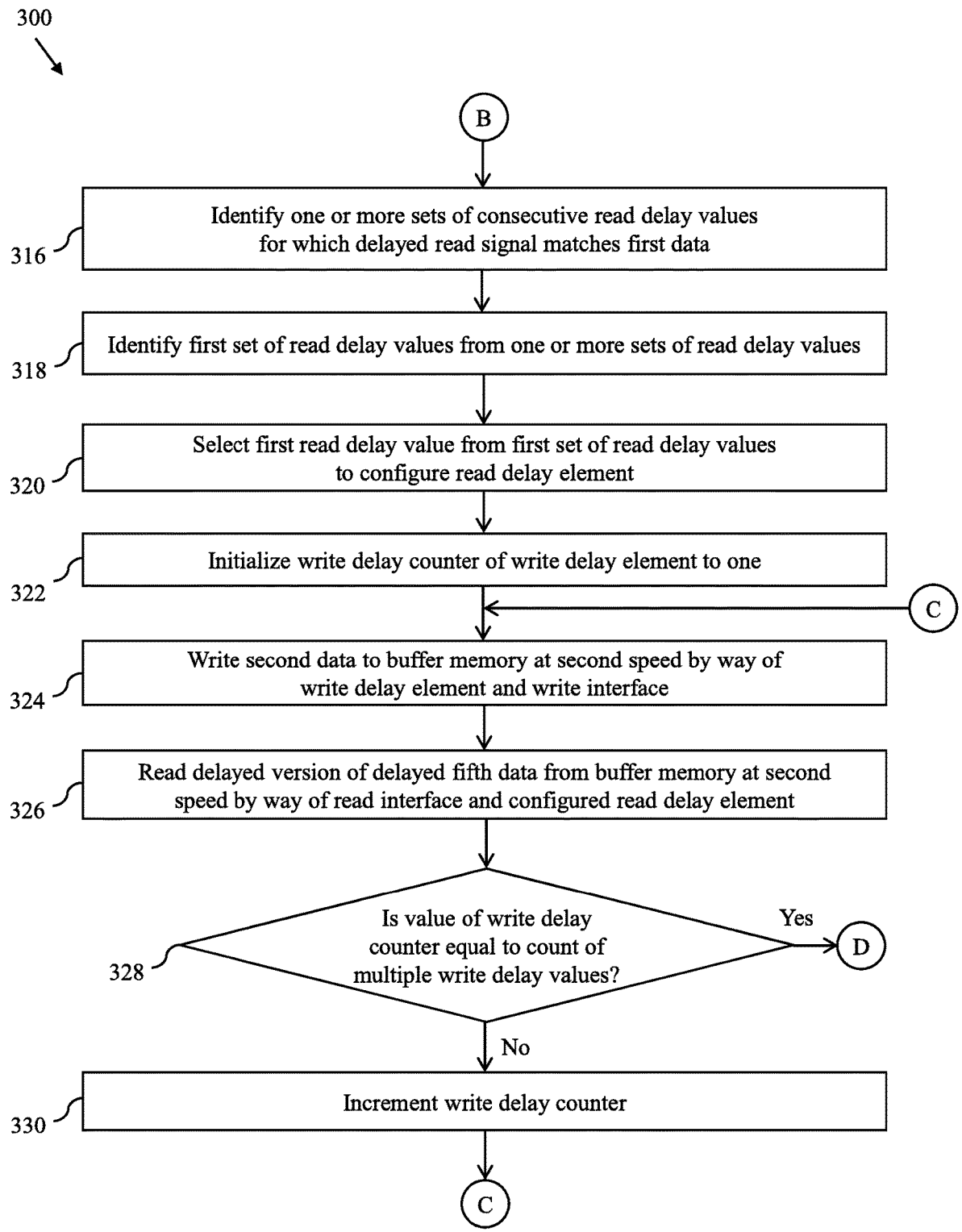
Figure 3C:
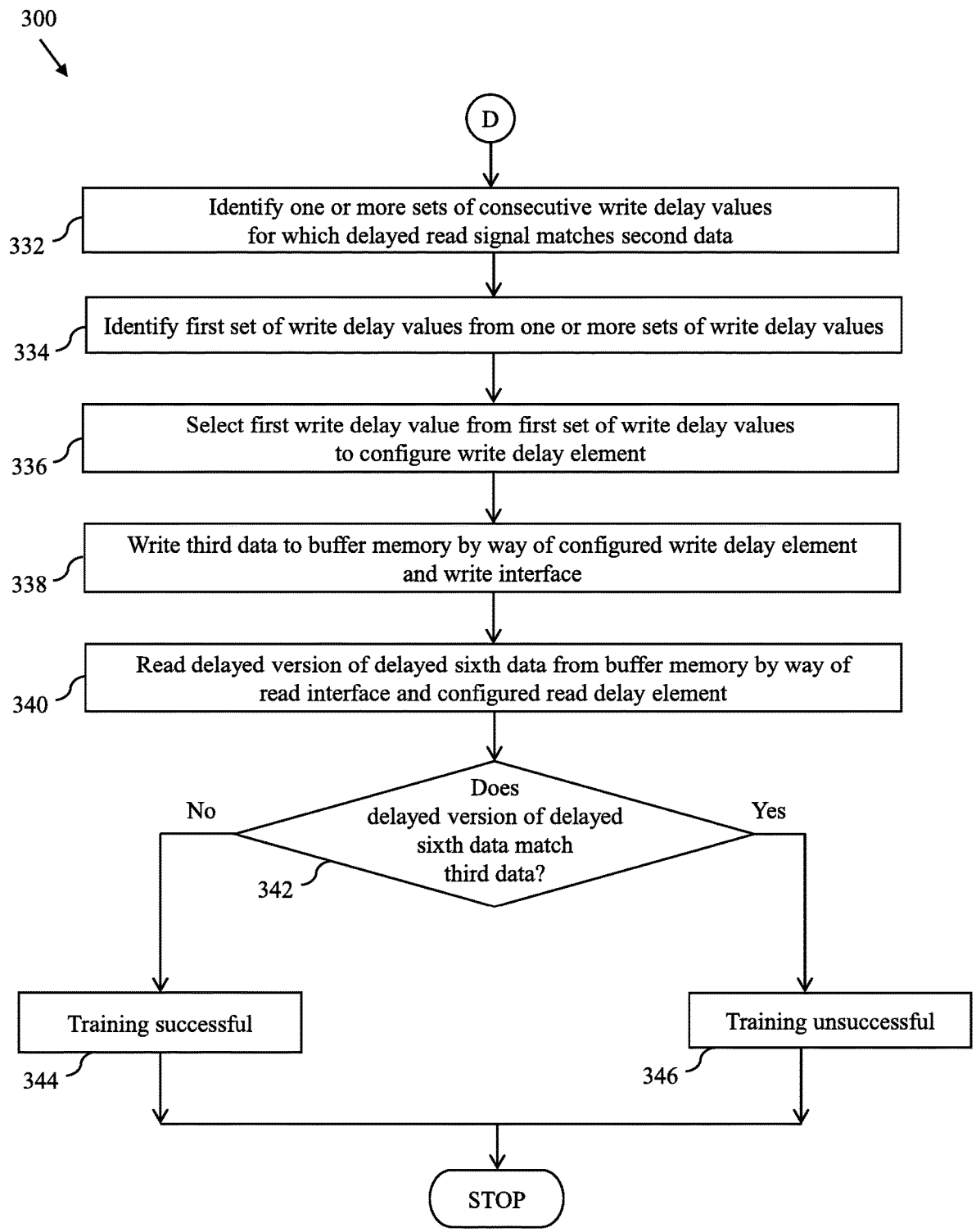

FIGS. 3A-3C, collectively, represent a flow chart 300 that illustrates a method for training the write and read interfaces 206 and 208, in accordance with an embodiment of the present invention.

Referring now to FIG. 3A, at step 302, the training circuitry 210 receives the phase determination signal PDS at a logic high state. At step 304, the training circuitry 210 generates the select signal SL at logic high state.

At step 306, the training circuitry 210 writes the first data D1 at the first speed to the buffer memory 220 by way of the write delay element 216a and the write interface 206. The writing of the first data D1 at the first speed ensures that the first data D1 is correctly written to the buffer memory 220. At step 308, the training circuitry 210 initializes the read delay counter of the read delay element 216b to one.

At step 310, the training circuitry 210 reads the delayed version of the delayed first data DD1 at the second speed from the buffer memory 220 by way of the read interface 208 and the read delay element 216b. The training circuitry 210 initiates the read operation of the first data D1 from the buffer memory 220. The read interface 208 delays the first data D1. The delay corresponds to the signal skew introduced by the read interface 208. Thus, the read signal RS received by the read delay element 216b is the delayed first data DD1. Further, the read delay element 216b outputs the delayed read signal DRS which is the read signal RS that is delayed by a read delay value of the read delay element 216b. Thus, the delayed read signal DRS is the delayed version of the delayed first data DD1. Further, the read delay element 216b provides the delayed read signal DRS to the training circuitry 210. At step 312, the training circuitry 210 determines whether the value of the read delay counter is equal to the count of the multiple read delay values of the read delay element 216b. If at step 312, the training circuitry 210 determines that the value of the read delay counter is not equal to the count of the multiple read delay values, step 314 is performed. At step 314, the read delay counter is incremented and step 310 is performed. Thus, the read operation is repeated for each of the multiple read delay values. If at step 312, the training circuitry 210 determines that the value of the read delay counter is equal to the count of multiple read delay values, step 316 is performed.

Referring now to FIG. 3B, at step 316, the training circuitry 210 identifies the one or more sets of consecutive read delay values for which the delayed read signal DRS matches the first data D1. At step 318, the training circuitry 210 identifies the first set of read delay values, from the sets of consecutive read delay values, for which the count of consecutive read delay values is maximum.

At step 320, the training circuitry 210 selects the first read delay value from the first set of read delay values to configure the read delay element 216b. The training of the read interface 208 corresponds to configuration of the read delay element 216b with the first read delay value. The training circuitry 210 initiates the training of the write interface 206 after the read interface 208 is trained.

At step 322, the training circuitry 210 initializes the write delay counter of the write delay element 216a to one. At step 324, the training circuitry 210 writes the second data D2 at the second speed to the buffer memory 220 by way of the write delay element 216a and the write interface 206. The write delay element 216a introduces a delay equal to a write delay value to the second data D2 and outputs the delayed second data DD2 that is transmitted over the write interface 206. The write interface 206 introduces the signal skew in the delayed second data DD2, thereby further delaying the delayed second data DD2. Thus, the fifth data D5 is stored in the buffer memory 220.

At step 326, the training circuitry 210 reads the delayed version of the delayed fifth data DD5 at the second speed from the buffer memory 220 by way of the read interface 208 and the configured read delay element 216b. The training circuitry 210 initiates the read operation of the fifth data D5 from the buffer memory 220. The read interface 208 delays the fifth data D5. The delay corresponds to the signal skew introduced by the read interface 208. Thus, the read signal RS received by the read delay element 216b is the delayed fifth data DD5. Further, the read delay element 216b outputs the delayed read signal DRS. The delayed read signal DRS is the read signal RS delayed by the first read delay value of the read delay element 216b. Thus, the delayed read signal DRS is the delayed version of the delayed fifth data DD5. Further, the read delay element 216b provides the delayed read signal DRS to the training circuitry 210. At step 328, the training circuitry 210 determines whether the value of the write delay counter is equal to the count of the multiple write delay values of the write delay element 216a. If at step 328, the training circuitry 210 determines that the write delay counter is not equal to the count of multiple write delay values, step 330 is performed. At step 330, the write delay counter is incremented and step 324 is performed. Thus, the write and read operations are repeated for each of the multiple write delay values. If at step 328, the training circuitry 210 determines that the value of the read delay counter is equal to the count of the multiple write delay values, step 332 is performed.

Referring now to FIG. 3C, at step 332, the training circuitry 210 identifies the one or more sets of consecutive write delay values for which the delayed read signal DRS matches the second data D2. At step 334, the training circuitry 210 identifies the first set of write delay values, from the sets of consecutive write delay values, for which the count of consecutive write delay values is maximum.

At step 336, the training circuitry 210 selects the first write delay value from the first set of write delay values to configure the write delay element 216a. The configuration of the write delay element 216a with the first write delay value corresponds to the training of the write interface 206. Thus, the training circuitry 210 trains the write and read interfaces 206 and 208. After the write and read interfaces 206 and 208 are trained, the training circuitry 210 verifies the training of the write and read interfaces 206 and 208.

At step 338, the training circuitry 210 writes the third data D3 to the buffer memory 220 by way of the configured write delay element 216a and the write interface 206. The configured write delay element 216a delays the third data D3 by a delay equal to the first write delay value. Thus, the write delay element 216a outputs the delayed third data DD3 and provides the delayed third data DD3 to the buffer memory 220 by way of the write interface 206. The write interface 206 further delays the delayed third data DD3. The delay corresponds to the signal skew introduced by the write interface 206. Thus, the sixth data D6 is stored in the buffer memory 220.

At step 340, the training circuitry 210 reads the delayed version of the delayed sixth data DD6 from the buffer memory 220 by way of the read interface 208 and the configured read delay element 216b. The training circuitry 210 initiates the read operation of the sixth data D6 from the buffer memory 220. The read interface 208 delays the sixth data D6. The delay corresponds to the signal skew introduced by the read interface 208. Thus, the configured read delay element 216b receives the delayed sixth data DD6 by way of the read signal RS. The configured read delay element 216b further delays the delayed sixth data DD6 by a delay equal to the first read delay value. Thus, the configured read delay element 216b outputs the delayed version of the delayed sixth data DD6 as the delayed read signal DRS, and provides the delayed read signal DRS to the training circuitry 210.

At step 342, the training circuitry 210 determines whether the delayed version of the delayed sixth data DD6 matches the third data D3. If at step 342, the training circuitry 210 determines that the delayed version of the delayed sixth data DD6 matches the third data D3, step 344 is performed. At step 344, the training circuitry 210 determines that the training of the write and read interfaces 206 and 208 is successful. The training circuitry 210 generates the first end of training signal EOT1 at a logic high state for communicating the completion of the training of the write and read interfaces 206 and 208 to the controller. Further, the training circuitry 210 generates the second end of training signal EOT2 at a logic high state for communicating successful training of the write and read interfaces 206 and 208. The write and read interfaces 206 and 208 may thus be used by the functional circuitry 212 for the read and write operations in the functional phase, respectively. If at step 342, the training circuitry 210 determines that the delayed version of the delayed sixth data DD6 does not match the third data D3, step 346 is performed. At step 346, the training circuitry 210 determines that the training of the write and read interfaces 206 and 208 is unsuccessful. Thus, the training circuitry 210 generates the first end of training signal EOT1 at a logic high state for communicating the completion of the training of the write and read interfaces 206 and 208 to the controller. Further, the training circuitry 210 generates the second end of training signal EOT2 at a logic low state for communicating the unsuccessful training of the write and read interfaces 206 and 208 to the controller. When the training is unsuccessful, the controller may reinitiate the training of the write and read interfaces 206 and 208.

The training of the write and read interfaces 206 and 208 corrects the signal skew introduced by the write and read interfaces 206 and 208. As the training circuitry 210 performs the training of the write and read interfaces 206 and 208, the inclusion of a training circuitry in the second IC 204 is eliminated, thereby reducing an area consumed by the second IC 204 on the PCB 200. Further, an absence of a training circuitry in the second IC 204 eliminates a need for a standard training protocol. Since the training circuitry 210 does not adhere to a standard protocol, an IC other than the first and second ICs 202 and 204 may be included in the PCB 200 and interfaced with the first IC 202.

It will be understood by those of skill in the art that the same logical function may be performed by different arrangements of components that operate using either logic high or logic low signals. Therefore, variations in the arrangement of some of the components described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An electronic circuit board, comprising:
    a buffer memory; and
    a first integrated circuit (IC) that is connected to the buffer memory by way of read and write interfaces, the first IC comprising:
        read and write delay elements connected to the read and write interfaces, respectively; and
        a training circuitry for training the read and write interfaces, and connected to the read and write delay elements, wherein to train the read interface, the training circuitry is configured to:
            write first data to the buffer memory by way of the write interface;
            read second data from the buffer memory by way of the read interface and the read delay element, wherein the reading of the second data is executed for each read delay value of a plurality of read delay values of the read delay element; and
            select, from the plurality of read delay values, a first read delay value to configure the read delay element such that the second data matches the first data at the first read delay value, wherein the read interface is trained when the read delay element is configured with the first read delay value, and wherein the write interface is trained based on the trained read interface.

2. The electronic circuit board of claim 1, wherein to select the first read delay value from the plurality of read delay values, the training circuitry is further configured to:
    identify, from the plurality of read delay values, one or more sets of read delay values for which the second data matches the first data, wherein each set of read delay values includes consecutive read delay values; and
    identify a first set of read delay values from the one or more sets of read delay values based on a count of read delay values in each of the one or more sets of read delay values, wherein the first read delay value is selected from the first set of read delay values.

3. The electronic circuit board of claim 2, wherein the first read delay value is a center value of the first set of read delay values.

4. The electronic circuit board of claim 1, wherein to train the write interface, the training circuitry is further configured to:
    write, after the read interface is trained, third data to the buffer memory by way of the write delay element and the write interface;
    read fourth data from the buffer memory by way of the read interface and the configured read delay element, wherein the writing and reading of the third and fourth data are executed for each write delay value of a plurality of write delay values of the write delay element, respectively; and
    select, from the plurality of write delay values, a first write delay value to configure the write delay element, wherein the fourth data matches the third data at the first write delay value, and wherein the write interface is trained when the write delay element is configured with the first write delay value.

5. The electronic circuit board of claim 4, wherein to select the first write delay value from the plurality of write delay values, the training circuitry is further configured to:
    identify, from the plurality of write delay values, one or more sets of write delay values for which the fourth data matches the third data, wherein each set of write delay values includes consecutive write delay values; and
    identify a first set of write delay values from the one or more sets of write delay values based on a count of write delay values in each of the one or more sets of write delay values, wherein the first write delay value is selected from the first set of write delay values.

6. The electronic circuit board of claim 5, wherein the first write delay value is a center value of the first set of write delay values.

7. The electronic circuit board of claim 4, wherein the training circuitry is further configured to:
    write fifth data to the buffer memory by way of the configured write delay element and the write interface;
    read sixth data from the buffer memory by way of the read interface and the configured read delay element; and
    compare the sixth data with the fifth data, wherein the training circuitry determines that the training of the read and write interfaces is successful when the sixth data matches the fifth data.

8. A method for training read and write interfaces that are connected to a first integrated circuit (IC) and a buffer memory, the method comprising:
    writing, by a training circuitry of the first IC, first data to the buffer memory by way of the write interface;
    reading, by the training circuitry, second data from the buffer memory by way of the read interface and a read delay element of the first IC, wherein the reading of the second data is executed for each read delay value of a plurality of read delay values of the read delay element; and
    selecting, by the training circuitry from the plurality of read delay values, a first read delay value to configure the read delay element such that the second data matches the first data at the first read delay value, wherein the read interface is trained when the read delay element is configured with the first read delay value, and wherein the write interface is trained based on the trained read interface.

9. The method of claim 8, wherein the step of selecting the first read delay value from the plurality of read delay values further comprises:
    identifying, by the training circuitry from the plurality of read delay values, one or more sets of read delay values for which the second data matches the first data, wherein each set of read delay values includes consecutive read delay values; and
    identifying, by the training circuitry, a first set of read delay values from the one or more sets of read delay values based on a count of read delay values in each of the one or more sets of read delay values, wherein the first read delay value is selected from the first set of read delay values.

10. The method of claim 9, wherein the first read delay value is a center value of the first set of read delay values.

11. The method of claim 8, further comprising:
writing, by the training circuitry after the read interface is trained, third data to the buffer memory by way of a write delay element of the first IC and the write interface;
reading, by the training circuitry, fourth data from the buffer memory by way of the read interface and the configured read delay element, wherein the writing and reading of the third and fourth data are executed for each write delay value of a plurality of write delay values of the write delay element, respectively; and
selecting, by the training circuitry from the plurality of write delay values, a first write delay value to configure the write delay element, wherein the fourth data matches the third data at the first write delay value, and wherein the write interface is trained when the write delay element is configured with the first write delay value.

12. The method of claim 11, wherein the step of selecting the first write delay value from the plurality of write delay values further comprises:
identifying, by the training circuitry from the plurality of write delay values, one or more sets of write delay values for which the fourth data matches the third data, wherein each set of write delay values includes consecutive write delay values; and
identifying, by the training circuitry, a first set of write delay values from the one or more sets of write delay values based on a count of write delay values in each of the one or more sets of write delay values, wherein the first write delay value is selected from the first set of write delay values.

13. The method of claim 12, wherein the first write delay value is a center value of the first set of write delay values.

14. The method of claim 11, further comprising:
writing, by the training circuitry, fifth data to the buffer memory by way of the configured write delay element and the write interface;
reading, by the training circuitry, sixth data from the buffer memory by way of the read interface and the configured read delay element; and
comparing, by the training circuitry, the sixth data with the fifth data to determine whether the training of the read and write interfaces is successful, wherein the training of the read and write interfaces is successful when the sixth data matches the fifth data.

15. A method for training read and write interfaces that are connected to a first integrated circuit (IC) and a buffer memory, the method comprising:
writing, by a training circuitry of the first IC, first data to the buffer memory by way of the write interface;
reading, by the training circuitry, second data from the buffer memory by way of the read interface and a read delay element of the first IC, wherein the reading of the second data is executed for each read delay value of a plurality of read delay values of the read delay element;
selecting, by the training circuitry from the plurality of read delay values, a first read delay value to configure the read delay element such that the second data matches the first data at the first read delay value, wherein the read interface is trained when the read delay element is configured with the first read delay value;
writing, by the training circuitry after the read interface is trained, third data to the buffer memory by way of a write delay element of the first IC, and the write interface;
reading, by the training circuitry, fourth data from the buffer memory by way of the read interface and the configured read delay element, wherein the writing and reading of the third and fourth data are executed for each write delay value of a plurality of write delay values of the write delay element, respectively; and
selecting, by the training circuitry from the plurality of write delay values, a first write delay value to configure the write delay element such that the fourth data matches the third data at the first write delay value, wherein the write interface is trained when the write delay element is configured with the first write delay value.

16. The method of claim 15, wherein the step of selecting the first read delay value from the plurality of read delay values further comprises:
identifying, by the training circuitry from the plurality of read delay values, one or more sets of read delay values for which the second data matches the first data, wherein each set of read delay values includes consecutive read delay values; and
identifying, by the training circuitry, a first set of read delay values from the one or more sets of read delay values based on a count of read delay values in each of the one or more sets of read delay values, wherein the first read delay value is selected from the first set of read delay values.

17. The method of claim 16, wherein the first read delay value is a center value of the first set of read delay values.

18. The method of claim 15, wherein the step of selecting the first write delay value from the plurality of write delay values further comprises:
identifying, by the training circuitry from the plurality of write delay values, one or more sets of write delay values for which the fourth data matches the third data, wherein each set of write delay values includes consecutive write delay values; and
identifying, by the training circuitry, a first set of write delay values from the one or more sets of write delay values based on a count of write delay values in each of the one or more sets of write delay values, wherein the first write delay value is selected from the first set of write delay values.

19. The method of claim 18, wherein the first write delay value is a center value of the first set of write delay values.

20. The method of claim 15, further comprising:
writing, by the training circuitry, fifth data to the buffer memory by way of the configured write delay element and the write interface;
reading, by the training circuitry, sixth data from the buffer memory by way of the read interface and the configured read delay element; and
comparing, by the training circuitry, the sixth data with the fifth data to determine whether the training of the read and write interfaces is successful, wherein the training of the read and write interfaces is successful when the sixth data matches the fifth data.

* * * * *